Feb. 14, 1961 O. P. CLARK 2,972,062

TRANSISTOR BINARY COUNTER

Filed Oct. 28, 1957

INVENTOR
O. P. CLARK
BY Walter M. Hill
ATTORNEY

United States Patent Office 2,972,062
Patented Feb. 14, 1961

2,972,062

TRANSISTOR BINARY COUNTER

Omer P. Clark, New Vernon, N.J., assignor to Bell Telephone Laboratories, Incorporated, New York, N.Y., a corporation of New York Filed Oct. 28, 1957, Ser. No. 692,706

11 Claims. (Cl. 307—88.5)

Figure 1:
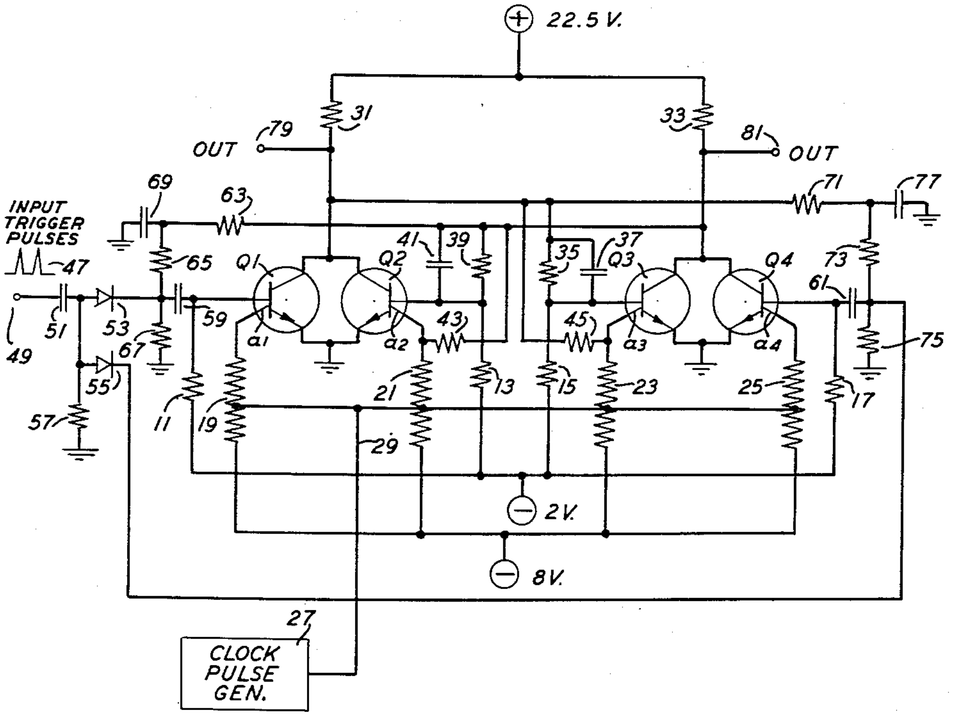

This invention pertains to pulse counters, particularly binary pulse counters wherein the active elements are transistors.

Digital computing and data handling systems generally employ assemblies of large numbers of bistable devices which successively switch between two opposite operating states in response to successively applied trigger pulses. The distinguishing charatcteristic of the two states of each such device is its output voltage, a high output voltage being associated with one state and a low output voltage being associated with the opposite state. By designating one of the states and the associated voltage output voltage as "1," and the other state and associated output voltage as "0," the device serves as a binary counter of trigger pulses applied thereto.

A particularly useful type of binary pulse counter is the bistable multivibration. Bistable multivibrators employing transistors as the active elements have been constructed, but have not been sufficiently reliable at very rapid trigger pulse repetition rates of the order of four or five megacycles per second. Trigger pulses occurring at such rates must be of very short duration in order to allow sufficient time for the counter to completely change state in the interval between successive pulses. Due to the finite rise and fall time of each pulse, this necessitates a very small pulse amplitude. The energy available in each trigger pulse for causing the binary counter to change state is, therefore, also very small. In prior transistor binary counters a large proportion of the energy in each trigger pulse has been dissipated by permitting the pulse to reach portions of the counter where it either serves no useful function or actually impedes correct counter operation. Attempts have been made to compensate for this energy loss by increasing the sensitivity of the counter to very weak pulses, and to further compensate for the resulting susceptibility to small amplitude noise pulses by disabling the counter except during uniformly spaced brief intervals when clock pulses are applied thereto to permit response to trigger pulses occurring in those intervals. Besides the fact that this technique does not attack the source of the problem of attaining reliable high speed operation, namely, the more efficient utilization of the trigger pulses, the energy required from the clock pulses is so large that an expensive high power clock pulse generator is necessary.

An object of the instant invention is to provide a transistor binary counter which is capable of reliable operation in response to trigger pulses occurring at very rapid repetition rates.

A further object is to provide a transistor binary counter which is capable of being controlled by very low power clock pulses.

A further object is to provide means whereby virtually all the energy in each of successive trigger pulses applied to a binary counter is efficiently utilized to produce successive changes of state of the counter.

By way of example and for purposes of illustration a binary counter constructed in accordance with the invention comprises a pair of junction transistors together with means for cross-coupling the base of each to the collector of the other to form a bistable multivibrator wherein one of the transistors assumes the first of two operating states and the other assumes the second of those states. A trigger pulse source is connected to the collector of each tratnsistor by respective diode means. In addition, pulse delay means are provided for applying to each diode means a bias voltage derived from the collector of the opposite transistor. Since the voltage at the collector of each transistor is at either of two different levels depending on its operating state, one of the bias voltages renders the diode means to which it is applied nonconductive. As a result, when a trigger pulse occurs it is conducted solely by the other diode means to the collector of the transistor to which it is connected. Via the associated cross-coupling to the base of the opposite transistor, the pulse is conveyed to that base and initiates a multivibrator operation in which both transistors interchange their operating states. While that operation is in process, and for an interval at least as long as the duration of the trigger pulse, the pulse delay means maintain the bias voltage at each diode substantially unchanged. All of the energy in the trigger pulse is thereby utilized to produce correct operation of the counter.

Figure 2:
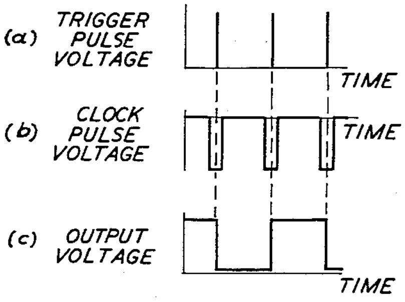

A more detailed description of an illustrative embodiment of the invention is presented in the following specification with reference to the accompanying drawings, in which:

Fig. 1 is a circuit diagram of a preferred embodiment of a binary counter constructed in accordance with the invention; and Fig. 2 is a series of waveform diagrams showing the relationship between various voltage pulses involved in the operation of the circuit of Fig. 1.

Referring to Fig. 1, transistors Q2 and Q3 are the active elements of the counter proper, transistors Q1 and Q4 serving as trigger pulse amplifiers for respectively driving transistors Q3 and Q2. All are n-p-n junction transistor tetrodes of the type having a collector, an emitter, a normal base and an auxiliary base. Of course, all could equally well be of the p-n-p type so long as all voltage polarities described hereinafter are reversed. A complete description of the n-p-n tetrode transistor, and of how biasing the auxiliary base sufficiently negative relative to the normal base results in greatly improved high frequency response, may be found in the article "A Junction Transistor Triode for High Frequency Use," by Wallace, Schimpf and Dickten, appearing on pages 1395–1400 of the November 1952 Proceedings of the I.R.E., volume 40. When the auxiliary base is not biased sufficiently negative relative to the normal base to achieve this improved response, the transistor behaves as a much more slowly operating conventional three element transistor. Consequently, a tetrode transistor can be "clocked" so as to have a high speed of response only in the intervals during which a negative clock pulse exists at its auxiliary base. In Fig. 1 the normal bases of transistors Q1, Q2, Q3 and Q4 are respectively connected by resistors 11, 13, 15 and 17 to the negative terminal of a direct voltage source of two volts with respect to ground. The auxiliary bases *a*1, *a*2, *a*3 and *a*4 of those transistors, respectively, are connected by resistors 19, 21, 23 and 25 to the negative terminal of a direct voltage source of eight volts with respect to ground. This biases the auxiliary base of each transistor six volts negative with respect to the normal base of the same transistor. By itself, this bias is insufficient to produce the described increase in speed of response which can be attained with tetrode transistors. However, a clock pulse generator 27 which produces a series of substantially rectangular negative pulses with respect to ground is connected by lead 29 to the midpoint of each of resistors 19, 21, 23 and 25. Each such clock pulse thereby drives the auxiliary bases sufficiently negative to attain the described increase in speed of response. Since very little current need be supplied to the auxiliary base of a tetrode transistor in comparison with that supplied to the normal base, very little power is required from clock pulse generator 27.

The emitter of each transistors Q1, Q2, Q3 and Q4 is grounded. The collectors of transistors Q1 and Q2 are connected together and by a resistor 31 to the positive terminal of a direct voltage source of 22.5 volts with respect to ground. The collectors of transistors Q3 and Q4 are also connected together and by a resistor 33 to the positive terminal of the same voltage source. The collectors of transistors Q1 and Q2 are further connected to the normal base of transistor Q3 by a resistor 35 shunted by a capacitor 37. Similarly, the collectors of transistors Q3 and Q4 are connected to the normal base of transistor Q2 by a resistor 39 shunted by a capacitor 41.

It is apparent that the base of each of transistors Q1, Q2, Q3 and Q4 is biased two volts negative with respect to the emitter, so that each of those transistors tends to be normally nonconducting or "off." In the case of transistors Q2 and Q3, however, the collector voltage of either will be positive when it is "off" and will be virtually at ground when it is "on." Since the collector of each of those transistors is coupled to the base of the other, the collector voltage of the one which is "off" will cause the other to be "on" by applying a positive voltage to its base. The low voltage of the collector of the "on" transistor will then be insufficient to overcome the negative two-volt bias of the base of the "off" transistor, so that transistor will remain "off."

In order to assure that the voltage between the normal and auxiliary base of each of transistors Q2 and Q3 remains substantially constant regardles which of those transistors is "on" and which is "off," auxiliary base *a*2 of transistor Q2 is connected to the collector of transistor Q3 by a resistor 43, and auxiliary base *a*3 of transistor Q3 is connected to the collector of transistor Q2 by a resistor 45. The virtue of this arrangement may be perceived by assuming that transistor Q2 is "on" and transistor Q3 is "off," and that transistor Q3 is suddenly caused to turn "on." The resultant drop in voltage at the collector of transistor Q3 then not only drives the normal base of transistor Q2 negative, causing that transistor to turn "off," but also drives the auxiliary base *a*2 of transistor Q2 negative by a substantially equal amount. In addition, the rise in voltage at the collector of transistor Q2 drives both the normal base and the auxiliary base of transistor Q3 positive by substantially equal amounts. In this way the requisite auxiliary base bias for rapid response of each of transistors Q2 and Q3 is maintained even during the intervals in which their states are reversed.

A train of uniformly spaced positive trigger pulses 47 is applied to the counter at its input terminal 49. The trigger pulses are timed by conventional synchronizing means (not shown) to occur during the clock pulses supplied by clock pulse generator 27, this time relationship being substantially as shown in waveforms (*a*) and (*b*) of Fig. 2. Input terminal 49 is connected by a coupled capacitor 51 to the input electrodes of a pair of diodes 53 and 55, an input load resistor 57 being provided between these electrodes and ground. The output electrode of diode 53 is connected by a coupling capacitor 59 to the normal base of transistor Q1, and the output electrode of diode 55 is connected by a coupling capacitor 61 to the normal base of transistor Q4. Diodes 53 and 55 serve to direct, or "steer," successive trigger pulses alternately to the bases of transistors Q1 and Q4. This is accomplished by biasing them with voltages derived from the collectors of transistors Q3 and Q2. In the case of diode 53, the biasing arrangement comprises a pair of resistors 63 and 65 connected in series between the collector of transistor Q3 and the output electrode of the diode, together with a resistor 67 connecting that electrode to ground and a capacitor 69 shunting resistors 65 and 67. The biasing arrangement for diode 55 similarly comprises a pair of resistors 71 and 73 connected in series between the collector of transistor Q2 and the output electrode of the diode, together with a resistor 75 connecting that electrode to ground and a capacitor 77 shunting resistors 73 and 75.

The operation of the foregoing trigger pulse steering arrangement will be explained by assuming that transistor Q2 is "on" and transistor Q3 is "off" at the time a trigger pulse occurs. As explained above, transistors Q1 and Q4 are then both "off." The voltage at the collector of transistor Q3 when it is "off" is sufficiently positive so the portion thereof existing across resistor 67 maintains diode 53 nonconductive in spite of the application of a positive trigger pulse to its input electrode. On the other hand, the voltage at the collector of transistor Q2 when it is "on" is virtually at ground level, so that diode 55 conducts the full amplitude of the trigger pulse which is applied to its input electrode. The trigger pulse is therefore conducted by diode 55 to the base of transistor Q4, but is isolated by diode 53 from the base of transistor Q1. Transistor Q4 conducts in response to the trigger pulse, producing an amplified negative pulse at its collector and at the collector of transistor Q3 connected thereto. This negative pulse is conveyed by capacity 41 to the normal base of transistor Q2, causing it to turn "off." The resulting positive voltage step at the collector of transistor Q2 is conveyed by capacitor 37 to the normal base of transistor Q3, causing it to turn "on." The consequent low voltage at the collector of transistor Q3 is then inadequate to overcome the negative two volt bias of the base of transistor Q2, so that transistor will remain in the "off" state. Transistor Q4 turns "off" as soon as the trigger pulse terminates, so that transistors Q2 and Q3 will then remain quiescent in the "off" and "on" states, respectively. It is apparent that the state of the counter is evidenced by the relative voltage levels at the collectors of transistors Q2 or Q3, so that output terminals 79 and 81 are respectively connected thereto. The waveform of the voltage at output terminal 81, in accordance with the foregoing description, will be as shown in waveform (*c*) of Fig. 2. The waveform at output terminal 79 will be the same except shifted on the time axis by an amount equal to the interval between successive trigger pulses.

The function of capacitors 69 and 77 is to introduce sufficient time delay, or "memory," to maintain the bias voltages applied to diodes 53 and 55 substantially constant until after each trigger pulse has terminated. The importance of such delay may be understood by considering how the circuit would operate if those capacitors were absent. Assume, as before, that transistor Q2 is "on" and transistor Q3 is "off," diode 53 thereby being biased to be nonconducting and diode 55 being biased to be conducting. When a trigger pulse occurs transistors Q2 and Q3 will start to change their states, so that the bias voltage applied to diode 53 falls and that applied to diode 55 rises. Since the counter is designed for extremely rapid trigger pulse response, this could result in the bias voltages applied to both diodes becoming equal while the trigger pulse is still present. A portion of the pulse would then pass through diode 53 as well as through diode 55, thus dissipating a considerable portion of the already small pulse energy. This alone might result in failure of the counter to operate. In addition, it is also possible that the trigger pulse might still be present when diode 55 becomes completely nonconducting and diode 53 becomes fully conducting. In that case the counter would revert to its original state. Both of these possibilities are prevented by capacitors 69 and 77 by preventing the voltage across resistors 65 and 67 and that across resistors 73 and 75 from changing for a definite time interval at least equal to the duration of the trigger pulse. When transistor Q3 starts to turn "on," thus producing a drop in its collector voltage, the effect is isolated from resistors 65 and 67 until capacitor 69 discharges through resistor 63. Similarly, as transistor Q2 starts to turn "off" the rise in its collector voltage is isolated from resistors 73 and 75 until capacitor 77 charges through resistor 71. Of course, it will be evident to those skilled in the art that the requisite time delay in coupling the voltages at the collectors of transistors Q2 and Q3 to the output terminals of diodes 55 and 53 could be introduced by a variety of reactive networks in place of the shunting capacitors specifically described. A still further alternative would be to connect a short length of high frequency transmission line in each of those coupling paths.

While particular values of the various supply voltages have been specified, it should be clear that these are only illustrative of many combinations of supply voltages which would be equally satisfactory. In general, the values of the voltages and circuit elements employed are dependent on the operating requirements of the particular transistors which may be used. It should also be clear that if the trigger pulses applied to input terminal 49 are of sufficient power to cause transistors Q2 and Q3 to change state without prior amplification, transistors Q1 and Q4 can be dispensed with. This, and many other circuit modifications, will be evident to those skilled in the pulse circuitry art without departing from the scope and teachings of applicant's invention.

What is claimed is:

1. A binary counter comprising a pair of junction transistor tetrodes which each have an input electrode, an output electrode and an auxiliary electrode, voltage coupling means respectively connecting the output electrode of each of said transistors to the input electrode of the opposite transistor to form a regenerative feedback loop wherein said transistors assume mutually opposite operating states which they interchange when a pulse is applied to the input electrode of the transistor in a selected one of those states, said transistors being adapted to interchange their states at a higher speed when the potentials at their auxiliary electrodes are increased, a source of trigger pulses, a pair of diodes, means respectively connecting the first of said diodes between said source and the output electrode of the first of said transistors and the second of said diodes between said source and the output electrode of the second of said transistors, a pair of pulse delay means respectively connecting the output electrode of said first transistor to said second diode and the output electrode of said second transistors to said first diode, each of said pulse delay means being adapted to apply a biasing voltage to the diode connected thereto which remains substantially constant during each of said trigger pulses, and means for applying clock pulses to the auxiliary electrode of each of said transistors to increase the potential of those electrodes substantially coincidentally with each of said trigger pulses.

2. A binary counter comprising first and second junction transistor tetrodes, voltage coupling means cross-connecting the input and output electrodes of said transistors, first and second diodes connected at their input terminals to a first source of trigger pulses, an auxiliary electrode of each of said transistors connected to a second source of trigger pulses, means respectively connecting the first diode output terminal to the first transistor output electrode and the second diode output terminal to the second transistor output electrode, and a pair of pulse delay means respectively connecting said first transistor output electrode to said second diode output terminal and said second transistor output electrode to said first diode output terminal, each of said pulse delay means being adapted to apply a biasing voltage to the diode connected thereto which remains substantially constant during concurrence of trigger pulses from said first and second sources.

3. A binary counter comprising a pair of junction transistor tetrodes each having an input electrode and an output electrode, an auxiliary input electrode, voltage coupling means cross-connecting the input and output electrodes of said transistors to form a regenerative feedback loop wherein said transistors assume mutually opposite operating states which they interchange when a pulse is applied to the input electrode of the transistor in a selected one of those states, an input terminal, a pair of diodes, means respectively connecting one of said diodes between said input terminal and the output electrode of one of said transistors and the other diode between said input terminal and the output of the other transistor, a pair of pulse delay means respectively connected in series with said diodes between the output electrodes of said transistors and said input terminal, each of said pulse delay means being adapted to apply a biasing voltage to the diode connected thereto which remains substantially constant during each trigger pulse, and means connected to said auxiliary input electrode for applying clock pulses to each of said transistors concurrently with said trigger pulses.

4. A binary counter comprising a pair of junction transistor tetrodes which each have a collector, a normal base and an auxiliary base, voltage coupling means for cross-connecting the collector of each of said transistors to the normal base of the opposite transistor to form a regenerative feedback loop wherein said transistors assume mutually opposite operating states which they interchange when a pulse is applied to the normal base of the transistor in a selected one of those states, said transistors being adapted to interchange their states at a higher speed when the potentials at their auxiliary bases are increased, first pulse delay coupling means connected to the collector of said first transistor for deriving therefrom a first bias voltage, second pulse delay coupling means connected to the collector of said second transistor for deriving therefrom a second bias voltage, each of said bias voltages being at a first level when the transistor from which it is derived is in the first of said operating states and being at a second level when that transistor is the second of those states, said pulse delay coupling means being adapted to maintain said bias voltages substantially constant for a predetermined interval following a change of the operating states of said amplifiers, an input terminal for connection to a source of trigger pulses which are each of shorter duration than said predetermined interval, first pulse steering means connecting said input terminal to the collector of the first of said transistors, second pulse steering means connecting said input terminal to the collector of second of said transistors, means for respectively connecting said first and second pulse delay couplings to the second and first of said pulse steering means to respectively apply said first and second bias voltages thereto, each of said pulse steering means being adapted to be conductive only when the bias voltage applied to it is at said first level, and a source of clock pulses connected to the auxiliary electrode of each of said transistors for increasing the potential thereof substantially coincidentally with each of trigger pulses applied to said input terminal.

5. A binary counter comprising a pair of transistors which each have a collector, a normal base and an auxiliary base, voltage coupling means cross-connecting the collector of each of said transistors to the normal base of the opposite transistor to form a regenerative feedback loop wherein said transistors assume mutually opposite operating states which they interchange when a pulse is applied to the normal base of the transistor in a selected one of those states, said transistors being adapted to interchange their states at a higher speed when the voltage between the normal base and auxiliary base of each is increased, means for applying a relatively small bias voltage between the normal base and auxiliary base of each of said transistors, a clock pulse source connected between the normal base and auxiliary base of each of said transistors for increasing the voltage therebetween during successive uniformly spaced intervals, and means for applying a trigger pulse during each of said intervals to the normal base of the one of said transistors which is in said selected state.

6. The binary counter of claim 5, and further including means for cross-connecting the auxiliary base of each of said transistors to the collector of the opposite transistor.

7. A binary counter comprising a pair of transistors which each have a collector, a normal base and an auxiliary base, voltage coupling means cross-connecting the collector of each of said transistors to the normal base of the opposite transistor to form a regenerative feedback loop wherein one of said transistors assumes a first operating state in which the voltage at its collector is at a reference level and the opposite transistor assumes a second operating state in which the voltage at its collector is at a second level, said transistors being adapted to interchange their states in response to application of a voltage pulse to the normal base of the transistor in a selected one of said states while an enabling voltage is present at the auxiliary base of each of said transistors, a clock pulse source connected to the auxiliary bases of said transistors for applying an enabling voltage thereto during predetermined time intervals, a pair of diodes which each have an input terminal and an output terminal, first voltage delay means connected at its input terminal to the collector of the first of said transistors and at its output terminal to the output terminal of the first of said diodes, second voltage delay means connected at its input terminal to the collector of the second of said transistors and at its output terminal to the output terminal of the second of said diodes, each of said voltage delay means being adapted to produce a first bias voltage at its output terminal a predetermined delay after application of a constant voltage at said reference level to its input terminal and to produce a second bias voltage at its output terminal the same predetermined delay after application of a constant voltage at said second level to its input terminal, said predetermined delay being shorter than any of said predetermined time intervals, a pair of pulse transmitting means respectively further connecting the output terminals of said first and second diodes to the collectors of said second and first transistors, a source of trigger voltage pulses occurring during said predetermined time intervals and extending from the level of said first bias voltage to the level of said second bias voltage, the duration of each of said trigger voltage pulses being less than said predetermined delay, and means for connecting said trigger voltage pulse source to the input terminals of said diodes.

8. The binary counter of claim 7, wherein each of said voltage delay means is a reactive impedance which resists sudden changes in the voltage between its input and output terminals.

9. A binary counter comprising a pair of transistors which each have a collector, a normal base and an auxiliary base, voltage coupling means cross-connecting the collector of each of said transistors to the normal base of the opposite transistor to form a regenerative feedback loop wherein one of said transistors assumes a first operating state in which the voltage at its collector is at a reference level and the opposite transistor assumes a second operating state in which the voltage at its collector is at a second level, said transistors being adapted to interchange their states in response to application of a voltage pulse to the normal base of the transistor in a selected one of said states while an enabling voltage is present at the auxiliary base of each of said transistors, a clock pulse source connected to the auxiliary bases of said transistors for applying an enabling voltage thereto during predetermined time intervals, a pair of diodes which each have an input terminal and an output terminal, first voltage delay means connected at its input terminal to the collector of the first of said transistors and at its output terminal to the output terminal of the first of said diodes, second voltage delay means connected at its input terminal to the collector of the second of said transistors and at its output terminal to the output terminal of the second of said diodes, each of said voltage delay means being adapted to produce a first bias voltage at its output terminal a predetermined delay after application of a constant voltage at said reference level to its input terminal and to produce a second bias voltage at its output terminal the same predetermined delay after application of a constant voltage at said second level to its input terminal, said predetermined delay being shorter than any of said predetermined time intervals, a pair of normally nonconducting pulse amplifiers further respectively connecting the output terminals of said first and second diodes to the collectors of said second and first transistors, each of said pulse amplifiers being adapted to become conducting when a pulse is produced at the output terminal of the diode connected thereto, a source of trigger voltage pulses occurring during said predetermined time intervals and extending from the level of said first bias voltage to the level of said second bias voltage, the duration of each of said trigger voltage pulses being less than said predetermined delay, and means for connecting said trigger voltage pulse source to the input terminals of said diodes.

10. The binary counter of claim 9, wherein each of said pulse amplifiers is a tetrode transistor having an auxiliary base connected to said clock pulse source.

11. A pair of transistors which each have a base, an auxiliary base, a grounded emitter, and a collector, voltage coupling means for cross-connecting the collector and base of the first of said transistors with the base and collector of the second of said transistors to form a binary counter, a pair of diodes which each have an input terminal and an output terminal, a pair of pulse transmitting means respectively connecting the output terminals of said diodes to the collectors of said transistors, a pair of voltage delay means respectively further connecting the output terminals of said diodes to the collectors of the opposite transistors, and means for concurrently applying trigger pulses of opposite polarity to said auxiliary bases and to the input terminals of said diodes.

References Cited in the file of this patent

UNITED STATES PATENTS

| | | |
|---|---|---|
| 2,569,345 | Shea | Sept. 25, 1951 |
| 2,591,961 | Moore et al. | Apr. 8, 1952 |
| 2,757,286 | Wanlass | July 31, 1956 |
| 2,787,712 | Priebe et al. | Apr. 2, 1957 |
| 2,861,200 | Henle et al. | Nov. 18, 1958 |
| 2,868,455 | Bruce et al. | Jan. 13, 1959 |
| 2,869,000 | Bruce | Jan. 13, 1959 |
| 2,884,544 | Warnock | Apr. 28, 1959 |
| 2,885,574 | Roesch | May 5, 1959 |